United States Patent
Inagaki et al.

(10) Patent No.: US 9,287,250 B2
(45) Date of Patent: Mar. 15, 2016

(54) PACKAGE SUBSTRATE

(71) Applicant: IBIDEN CO., LTD., Ogaki-shi (JP)

(72) Inventors: Yasushi Inagaki, Ogaki (JP); Yasuhiro Takahashi, Ogaki (JP); Satoshi Kurokawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/734,065

(22) Filed: Jun. 9, 2015

(65) Prior Publication Data

US 2015/0357316 A1    Dec. 10, 2015

(30) Foreign Application Priority Data

Jun. 9, 2014   (JP) ................. 2014-118599

(51) Int. Cl.
| | |
|---|---|
| H01L 25/18 | (2006.01) |
| H01L 23/498 | (2006.01) |
| H01L 23/528 | (2006.01) |
| H01L 23/00 | (2006.01) |
| H01L 23/31 | (2006.01) |

(52) U.S. Cl.
CPC ............ *H01L 25/18* (2013.01); *H01L 23/3157* (2013.01); *H01L 23/49827* (2013.01); *H01L 23/49838* (2013.01); *H01L 23/528* (2013.01); *H01L 24/17* (2013.01); *H01L 2224/16227* (2013.01); *H01L 2224/16235* (2013.01); *H01L 2924/1431* (2013.01); *H01L 2924/1434* (2013.01)

(58) Field of Classification Search
CPC ................ H01L 25/18; H01L 23/3157; H01L 23/49827; H01L 23/528; H01L 24/17
USPC ........................................................ 257/774
See application file for complete search history.

(56) References Cited

U.S. PATENT DOCUMENTS

| | | | | | |
|---|---|---|---|---|---|
| 7,279,771 | B2* | 10/2007 | Sunohara | .......... | H01L 23/49822 174/255 |
| 9,035,463 | B2* | 5/2015 | Shizuno | ............ | H01L 23/49827 257/774 |
| 2004/0090758 | A1* | 5/2004 | Horikawa | ......... | H01L 23/49816 361/782 |
| 2013/0168134 | A1* | 7/2013 | Tominaga | ............ | H05K 3/4673 174/251 |
| 2014/0102768 | A1* | 4/2014 | Shizuno | .................. | H01L 24/14 174/251 |
| 2014/0301058 | A1* | 10/2014 | Sunohara | .......... | H01L 23/49822 361/783 |

FOREIGN PATENT DOCUMENTS

JP               6-053349           2/1994

* cited by examiner

*Primary Examiner* — Luan C Thai

(74) *Attorney, Agent, or Firm* — Oblon, McClelland, Maier & Neustadt, L.L.P.

(57) ABSTRACT

A package substrate includes an inner interlayer, a first conductor layer on the inner interlayer, a second conductor layer on which the inner interlayer is formed, an outermost interlayer on the first conductor layer, an outermost conductor layer on the outermost interlayer and including first and second pads positioned to mount first and second electronic components on the outermost interlayer, outermost vias connecting the first and outermost conductor layers through the outermost interlayer, and skip vias connecting the outermost and second conductor layers through the outermost and inner interlayers. The first conductor layer includes a first circuit connecting two outermost vias, and the outermost conductor layer includes an outermost circuit connecting one of the two outermost vias and one skip via such that the first conductor circuit, two outermost vias, outermost circuit and one skip via form a connection path connecting one second pad and the second conductor layer.

20 Claims, 12 Drawing Sheets

PACKAGE SUBSTRATE

CROSS-REFERENCE TO RELATED APPLICATIONS

The present application is based upon and claims the benefit of priority to Japanese Patent Application No. 2014-118599, filed Jun. 9, 2014, the entire contents of which are incorporated herein by reference.

BACKGROUND OF THE INVENTION

1. Field of the Invention

The present invention relates to a method for manufacturing a package substrate on which multiple electronic components are mounted.

2. Description of Background Art

Japanese Patent Laid-Open Publication No. HEI 06-53349 describes a multichip module substrate. According Japanese Patent Laid-Open Publication No. HEI 06-53349, two LSIs are mounted on one substrate. The two LSIs are connected by wiring layers, and the wiring layers are depicted in different insulating layers. The entire contents of this publication are incorporated herein by reference.

SUMMARY OF THE INVENTION

According to one aspect of the present invention, a package substrate includes an inner resin insulating interlayer, a first conductor layer formed on the inner resin insulating interlayer, a second conductor layer on which the inner resin insulating interlayer is formed, an outermost resin insulating interlayer formed on the first conductor layer, an outermost conductor layer formed on the outermost resin insulating interlayer and including first pads and second pads such that the first pads are positioned to mount a first electronic component on the outermost resin insulating interlayer and the second pads are positioned to mount a second electronic component on the outermost resin insulating interlayer, outermost via conductors formed through the outermost resin insulating interlayer such that the outermost via conductors are connecting the first conductor layer and the outermost conductor layer, and skip via conductors formed through the outermost resin insulating interlayer and the inner resin insulating interlayer such that the skip via conductors are connecting the outermost conductor layer and the second conductor layer. The first conductor layer includes a first conductor circuit connecting two of the outermost via conductors, and the outermost conductor layer includes an outermost conductor circuit connecting one of the two of the outermost via conductors and one of the skip via conductors such that the first conductor circuit, the two of the outermost via conductors, the outermost conductor circuit and the one of the skip via conductors form a connection path connecting one of the second pads and the second conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
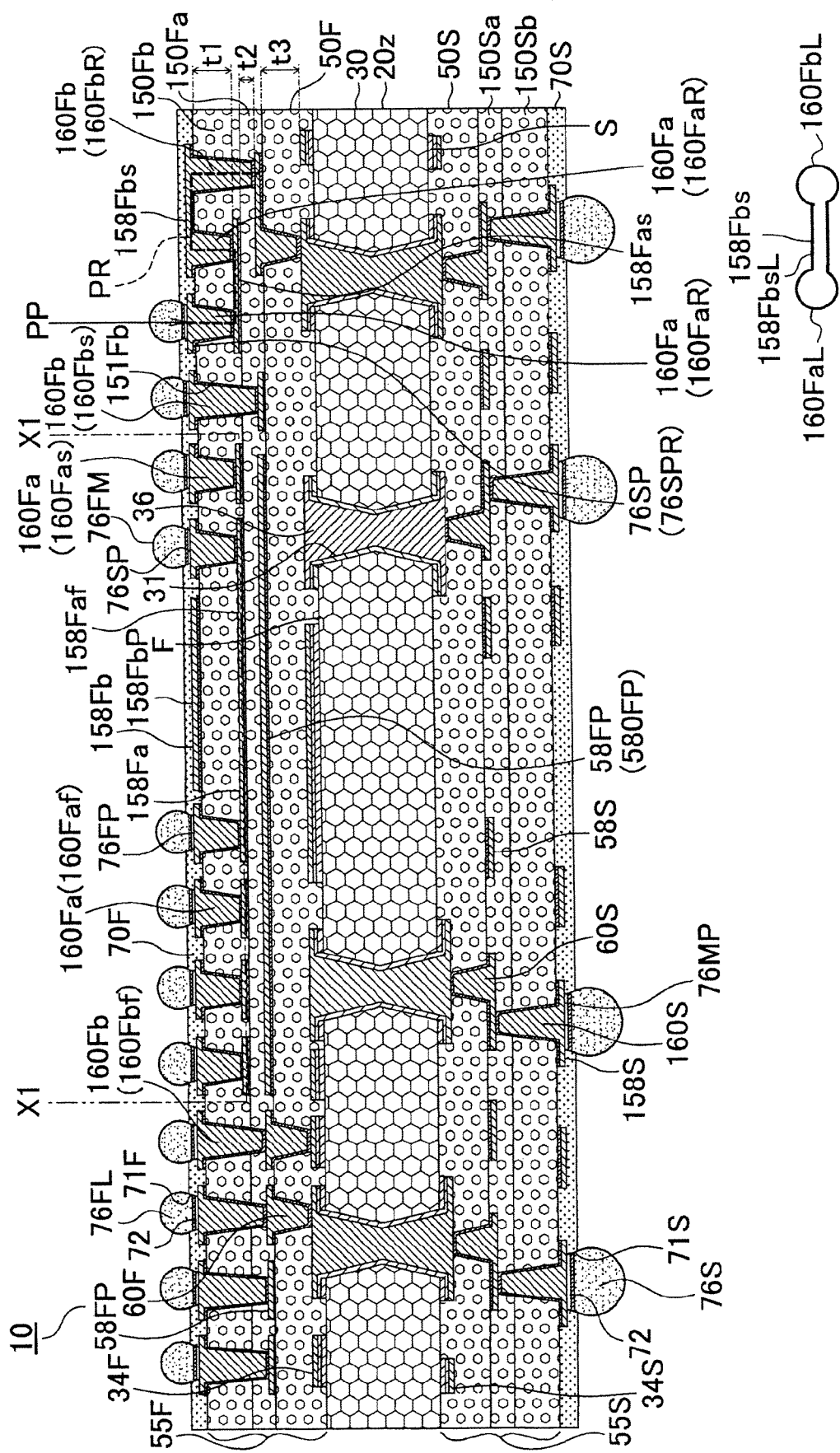
FIG. 1A is a cross-sectional view of a package substrate according to a first embodiment of the present invention.
FIG. 1B is a plan view of an outermost conductor circuit.

The embodiments will now be described with reference to the accompanying drawings, wherein like reference numerals designate corresponding or identical elements throughout the various drawings.

First Embodiment

Figure 10A:
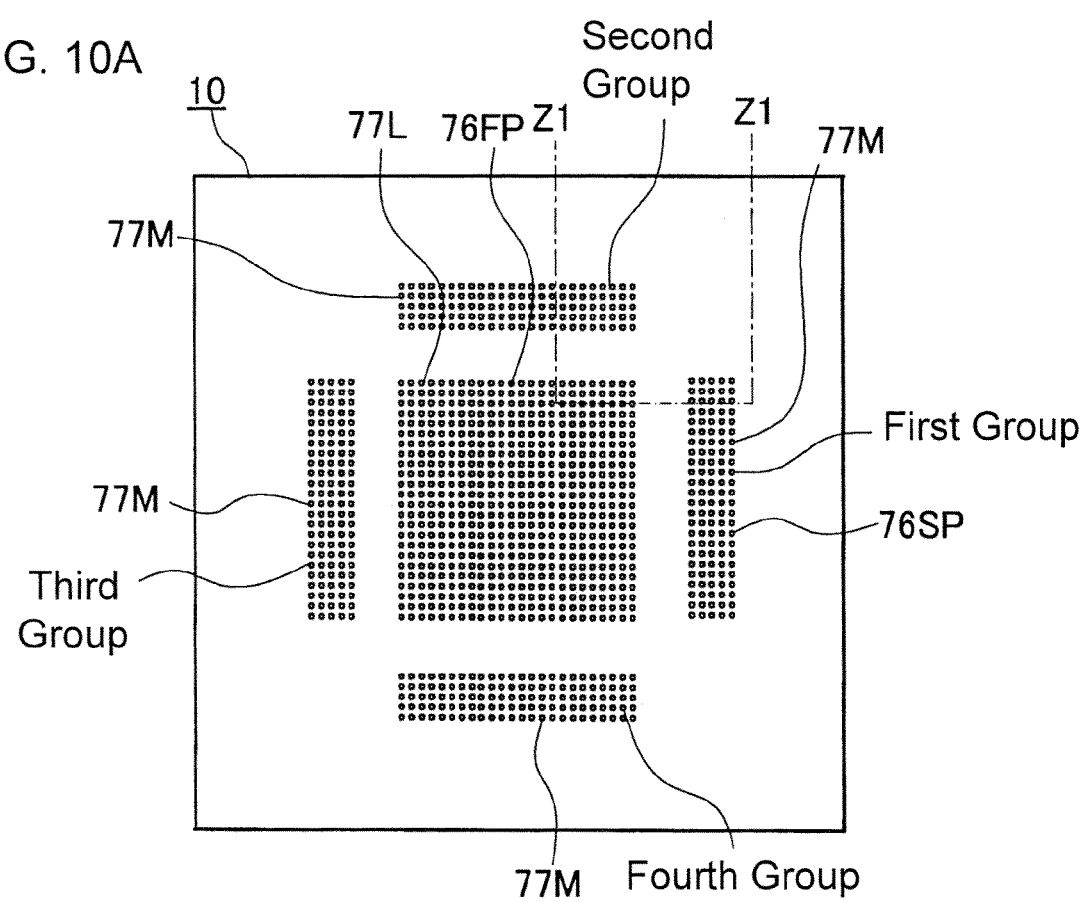
FIG. 10A is a plan view illustrating pad groups.
Figure 10B:
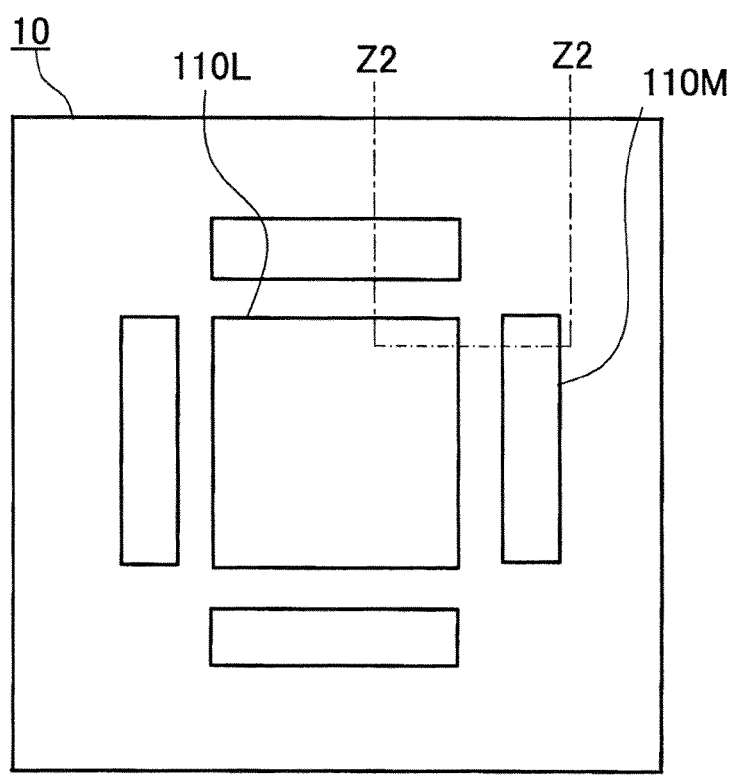
FIG. 10B is a plan view of the application example.

FIG. 10A illustrates a mounting surface of a package substrate according to a first embodiment of the present invention. FIG. 10B illustrates a plan view of an application example of the present embodiment. Electronic components are mounted on the package substrate of the present embodiment.

As illustrated in FIG. 10A, a mounting area (77L) for mounting a first electronic component such as a logic IC is formed at a central part of the mounting surface of the package substrate. First pads (76FP) for mounting the first electronic component are formed in a lattice-like shape in the mounting area (77L). The first pads (76FP) form a first pad group. Solder bumps for mounting the first electronic component are formed on the first pads. A mounting area (77M) for mounting a second electronic component such as a memory is formed outside of the mounting area (77L). In FIG. 10A, four mounting areas (77M) are formed around the mounting area (77L). Second pads (76SP) for mounting a second electronic component are formed in a lattice-like shape in each of the mounting areas (77M). The second pads form a second pad group. Solder bumps for mounting the second electronic component are formed on the second pads. In FIG. 10B, a logic IC (110L) is mounted on the solder bumps of the mounting area (77L), and a memory (110M) is mounted on the solder bumps of the mounting area (77M).

Figure 2:
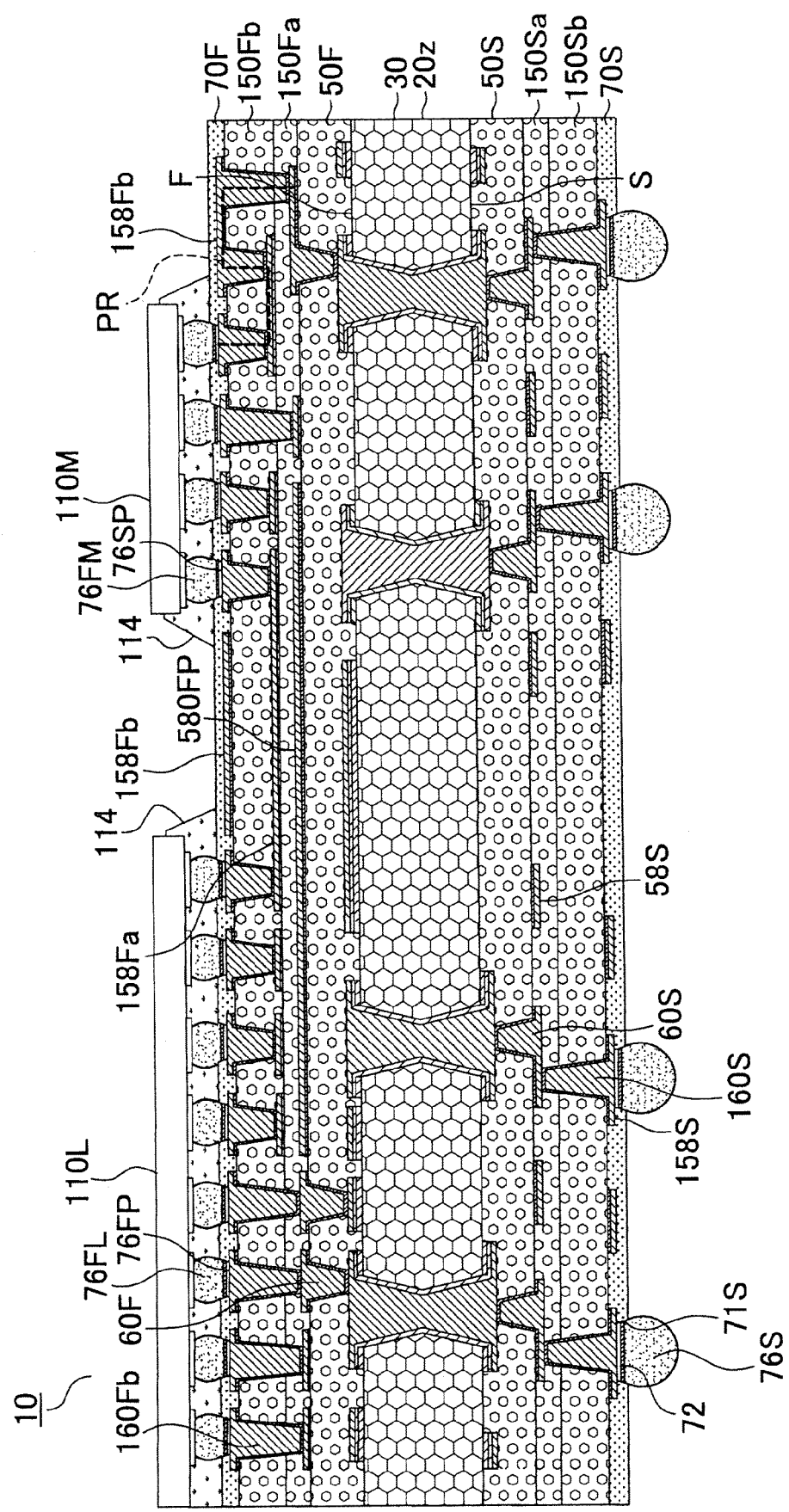
FIG. 2 is a cross-sectional view of an application example of the package substrate according to the first embodiment.

A cross section of the package substrate of the present embodiment along a line segment Z1-Z1 illustrated in FIG. 10A is illustrated in FIG. 1A. A cross section of the application example of the present embodiment along a line segment Z2-Z2 illustrated in FIG. 10B is illustrated in FIG. 2. The solder bumps (76FL) for mounting the first electronic component (110L) are formed on the first pads (76FP). The solder bumps (76FM) for mounting the second electronic component (110M) are formed on the second pads (76SP).

As illustrated in FIG. 1A, the package substrate of the present embodiment has an outermost conductor layer (158Fb) that contains pads for mounting an electronic component. Further, the package substrate has an outermost interlayer resin insulating layer (150Fb) that supports the outermost conductor layer (158Fb).

In the present embodiment, first via conductors (160Faf) that connect to the first pads (76FP) and second via conductors (160Fas) that connect to the second pads (76SP) are formed in the outermost interlayer resin insulating layer (150Fb). It is preferable that the first via conductors be formed directly below the first pads. It is preferable that the second via conductors be formed directly below the second pads. A first conductor layer (158Fa) that includes second conductor circuits (158Faf) and first conductor circuits (158Fas) is formed below the outermost interlayer resin insulating layer (150Fb). The first pads and the second pads are connected by the second conductor circuits (158Faf). That is, exchange of a signal or the like between the first electronic component and the second electronic component is performed via the second conductor circuits. All of the second conductor circuits connect the first pads and the second pads.

Data of one bit may be transmitted via one signal line (one second conductor circuit). A command or data that is processed by electronic equipment such as a personal computer is structured in one byte (8 bits). When the signal lines have different widths or thicknesses, the signal lines have different electrical characteristics such as transmission speeds. Therefore, differences may occur in transmission times of signals of a byte unit. It is expected that the signals are not properly processed or a processing time becomes long. It is expected that differences occur in transmission times between bits in one byte. Further, due to variations in the widths and the thicknesses of the signal lines, there may exist signal lines that have slow transmission speeds. It is expected that, due to these signal lines, processing is slowed.

The present embodiment has a dedicated wiring circuit in the first conductor layer. Therefore, when the wiring circuit containing signal lines is formed, manufacturing conditions and the like are set to match widths and thicknesses of the signal lines. Therefore, according to the present embodiment, variations in the widths and the thicknesses of the signal lines are reduced. The signal lines have substantially the same transmission speeds. The signals are properly processed. The processing is not slowed even when an amount of information is large.

Depending on a function of an electronic component, multiple dedicated wiring layers can be formed in the package substrate of the present embodiment. However, when multiple dedicated wiring layers are formed, it is expected that differences in the thicknesses and in the widths of the signal lines become large. Therefore, in order to reduce the variation in transmission times between the electronic components, it is preferable that a dedicated wiring circuit exist in one conductor layer. The first conductor layer (second conductor circuits) is provided below the outermost interlayer resin insulating layer. Therefore, a distance is reduced between the electronic components and the dedicated second conductor circuits.

A second conductor layer (58FP) containing conductor circuits is formed below the inner-layer interlayer resin insulating layer (150Fa). Supply of power to the electronic components, and the like, are performed via the second conductor layer. Therefore, the first pads and the second pads include pads that are connected to the second conductor layer. Connection between the second conductor layer and the pads connected to the second conductor layer is performed via skip via conductors (160Fb). The skip via conductors (160Fb) are via conductors that are formed in openings (151Fb) for the via conductors and penetrate through both the outermost interlayer resin insulating layer (150Fb) and the inner-layer interlayer resin insulating layer (150Fa) to reach the second conductor layer (58FP). The skip via conductors (160Fb) penetrate through both the outermost interlayer resin insulating layer and the inner-layer interlayer resin insulating layer.

The package substrate of the present embodiment does not have via conductors that penetrate through only the inner-layer interlayer resin insulating layer. Therefore, an area for forming the second conductor circuits in the first conductor layer is increased. A large number of the second conductor circuits are formed in the first conductor layer. Sophisticated electronic components can be mounted on the package substrate of the present embodiment. The dedicated second conductor circuits are formed in the single first conductor layer. Data transmission speed is increased.

The conductor circuits (first conductor layer) of the dedicated wiring layer have a thickness smaller than that of the outermost conductor layer and that of the second conductor layer. The thickness of the outermost conductor layer and the thickness of the second conductor layer are substantially the same. For example, the thickness of the first conductor layer is ½ of the thickness of the outermost conductor layer or less and is 3 μm or more. For example, the thickness of the first conductor layer is about 5 μm, and the thickness of the outermost conductor layer and the thickness of the second conductor layer are about 10 μm. As a result, fine conductor circuits can be formed in the dedicated wiring layer. Sophisticated electronic components can be mounted on the package substrate.

The second conductor circuits have a width smaller than that of the conductor circuits contained in the outermost conductor layer and the second conductor layer. Here, the width of the conductor circuits is a width of a narrowest conductor circuit in the conductor layer. The width of the second conductor circuits is in a range from ½ to ⅔ of the width of the conductor circuits contained in the outermost conductor layer and the second conductor layer. For example, the width of the second conductor circuits is about 5 μm, and the width of the conductor circuits contained in the outermost conductor layer and the second conductor layer is about 9 μm. The conductor circuits are each cut in a plane perpendicular to a propagation direction of the conductor circuit. A smallest distance among distances between opposing walls is the width of the conductor circuits.

A distance (width) of a space between adjacent second conductor circuits is smaller than a distance of a space between adjacent conductor circuits of the second conductor layer. The distance of the space between adjacent second conductor circuits is in a range from ½ to ⅔ of the distance of the space between adjacent conductor circuits of the second conductor layer. For example, the distance of the space between adjacent second conductor circuits is about 5 μm, and the distance of the space between adjacent conductor circuits of the second conductor layer is about 12 μm. Here, the distance of the space is a distance of a narrowest space in each conductor layer. The distance of the space and a distance between adjacent conductor circuits are the same. It is desirable that a signal line be a strip line or a micro strip line. When a signal line is a strip line, the signal line is sandwiched by the outermost conductor layer and the second conductor layer.

The package substrate of the present embodiment has the dedicated second conductor circuits, the outermost interlayer resin insulating layer that is formed on the dedicated second conductor circuits, the outermost conductor layer that is formed on the outermost interlayer resin insulating layer and contains the pads for mounting multiple electronic components, and the via conductors that penetrate through the outermost interlayer resin insulating layer and connect the pads and the dedicated wiring layer. The pads include the first pads for mounting the first electronic component and the second pads for mounting the second electronic component. Further, the first pads include first pads that connect to the dedicated second conductor circuits, first pads that connect to the first conductor circuits, and first pads that connect to the second conductor layer. Similarly, the second pads include second pads that connect to the dedicated second conductor circuits, second pads that connect to the first conductor circuits, and second pads that connect to the second conductor layer. The pads that are connected to the second conductor layer are connected to the skip via conductors. A circuit is closed by a first pad that connects to a dedicated second conductor circuit, a signal line in the dedicated second conductor circuit and a second pad that connects to the dedicated second conductor circuit.

The first conductor layer (158Fa) includes a first conductor circuit (158Fas) that is connected only to one of the electronic components (the memory (110M)). The first conductor circuit (158Fas) forms a portion of a connection path (PR) indicated by a dashed line in the drawings for circuiting of wiring. The outermost conductor layer (158Fb) includes an outermost conductor circuit (158Fbs) that connects a via conductor (160FaR) that is connected to the first conductor circuit (158Fas) and a skip via conductor (160FbR). As a result, a connection path (RP) is formed by a pad (76SPR) that is indicated using "PP" in FIG. 1A and is connected to the memory (110M), the via conductor (160FaR), the first conductor circuit (158Fas), the via conductor (160FaR), the outermost conductor circuit (158Fbs) and the skip via conductor (160FbR). FIG. 1B illustrates a plan view of the outermost conductor circuit (158Fbs). The outermost conductor circuit (158Fbs) is formed from a land (160FaL) of a via conductor (160FaR), a land (160FbL) of a skip via conductor (160FbR), and a connection wire (158FbsL) that connects the two lands. Via the connection path (PR), a signal from the pad connected to the memory (110M) can be transmitted to the second surface side of the package substrate via the skip via conductor. Although not illustrated in the drawings, further, a connection path is formed by a pad that is connected to the IC chip (110L), a via conductor, a first conductor circuit, another via conductor, an outermost conductor circuit and a skip via conductor. Since such a connection path (circuit) (PR) is provided, the package substrate of the second embodiment has a high degree of freedom for wiring.

That is, in the package substrate of the first embodiment, the first conductor layer includes a first conductor circuit that is connected to only one of the electronic components. The outermost conductor layer includes an outermost conductor circuit that connects a via conductor, which is connected to the first conductor circuit, and a skip via conductor. As a result, a connection path is formed by the pad that is connected to the one of the electronic components, the via conductor, the first conductor circuit, another via conductor, the outermost conductor circuit and the skip via conductor. Via the connection path, a signal from the pad connected to the one of the electronic components can be transmitted to the second surface side of the package substrate via the skip via conductor. Since such a circuit is provided, the degree of freedom for wiring is high.

The package substrate of the present embodiment may also have a core substrate that has a conductor layer. In this case, the inner-layer interlayer resin insulating layer is formed on the core substrate, and the conductor layer of the core substrate corresponds to the second conductor layer. A conductor layer (58FP) sandwiched by an interlayer resin insulating layer (50F) and the inner-layer interlayer resin insulating layer (150Fa) on the core substrate is the second conductor layer. A build-up layer includes interlayer resin insulating layers and conductor layers, and the interlayer resin insulating layers and the conductor layers are alternately laminated. A package substrate having a core substrate and a manufacturing method thereof are described, for example, in JP2007227512A. The entire contents of this publication are incorporated herein by reference.

The package substrate of the present embodiment may also be a coreless substrate. The coreless substrate includes interlayer resin insulating layers and conductor layers, and the interlayer resin insulating layers and the conductor layers are alternately laminated. A coreless substrate and a manufacturing method thereof are described, for example, in JP2005236244A.

A package substrate 10 illustrated in FIG. 1A has a core substrate 30 similar to that in JP2007227512A. The core substrate 30 has an insulating substrate (20z) that has a first surface (F) and a second surface (S) that is on an opposite side of the first surface. A conductor layer (34F) is formed on the first surface (F) of the insulating substrate (20z), and a conductor layer (34S) is formed on the second surface (S) of the insulating substrate (20z). The insulating substrate (20z) has through holes 31, and through-hole conductors 36 that connect the conductor layer (34F) and the conductor layer (34S) are formed inside the through holes 31. The through holes 31 for the through-hole conductors each have an hourglass shape similar to that in JP2007227512A.

A first build-up layer (55F) is formed on a first surface (F) of the core substrate 30. The first surface of the core substrate and the first surface of the insulating substrate are the same surface. The first build-up layer (55F) includes the interlayer resin insulating layer (upper side interlayer resin insulating layer) (50F) that is formed on the core substrate 30, the second conductor layer (58FP) on the interlayer resin insulating layer (50F), and via conductors (60F) that penetrate through the interlayer resin insulating layer (50F) and connect the second conductor layer (58FP) and the conductor layer (34F).

The first build-up layer further includes the inner-layer interlayer resin insulating layer (150Fa) that is formed on the interlayer resin insulating layer (50F) and the second conductor layer (58FP), and the first conductor layer (158Fa) that is formed on the inner-layer interlayer resin insulating layer (150Fa). There is no via conductor that penetrates through only the inner-layer interlayer resin insulating layer (150Fa).

The first build-up layer further includes the uppermost interlayer resin insulating layer (outermost interlayer resin insulating layer) (150Fb) that is formed on the inner-layer interlayer resin insulating layer (150Fa) and the first conductor layer (158Fa), the uppermost conductor layer (outermost conductor layer) (158Fb) that is formed on the uppermost interlayer resin insulating layer (150Fb), via conductors (uppermost via conductors) (160Fa) that penetrate through the uppermost interlayer resin insulating layer and connect the uppermost conductor layer and the first conductor layer, and the skip via conductors (160Fb) that penetrate through the uppermost interlayer resin insulating layer and the inner-layer interlayer resin insulating layer and connect the uppermost conductor layer and the second conductor layer. The uppermost conductor layer includes the first pads (76FP) for mounting the first electronic component, and the second pads (76SP) for mounting the second electronic component. The uppermost via conductors include the first via conductors (uppermost first via conductors) (160Faf) that connect the first pads and the first conductor layer, and the second via conductors (uppermost second via conductors) (160Fas) that connect the second pads and the first conductor layer. The skip via conductors include first skip via conductors (160Fbf) that connect the first pads and the second conductor layer, and second skip via conductors (160Fbs) that connect the second pads and the second conductor layer.

When multiple dedicated wiring layers are formed, it is preferable that the dedicated wiring layers are formed only in the first build-up layer.

A second build-up layer (55S) is formed on the second surface (S) of the core substrate 30. The second build-up layer (55S) includes interlayer resin insulating layers and conductor layers, and the interlayer resin insulating layers and the conductor layers are alternately laminated. It is preferable that the first build-up layer and the second build-up layer be symmetrically formed across the core substrate.

A solder resist layer (70F) having openings (71F) is formed on the first build-up layer (55F), and a solder resist layer (70S) having openings (71S) is formed on the second build-up layer (55S). The first pads (76FP) and the second pads (76SP) are exposed from the openings (71F) of the solder resist layer (70F) on the first build-up layer (55F). The (first solder bumps) solder bumps (76FL) are formed on the first pads, and the solder bumps (second solder bumps) (76FM) are formed on the second pads. It is preferable that a melting point of the first solder bumps and a melting point of the second solder bumps be different. Mounting yield and connection reliability are improved. Further, replacement of the electronic components can be easily performed. Solder bumps (third solder bumps) (76S) for connecting to a motherboard are formed on pads (76MP) that are exposed from the openings (71S) of the solder resist layer (70S) on the second build-up layer (55S). A metal film 72 such as Ni/Au or Ni/Pd/Au is formed on each of the pads (76FP, 76SP, 76MP). As illustrated in FIGS. 2 and 10B, the IC chip (110L) is mounted on the solder bumps (76FL) for mounting the IC chip, and the memory (110M) is mounted on the solder bumps (76FM) for mounting the memory. The package substrate 10 is mounted on a motherboard via the solder bumps (76S) that are formed on the second build-up layer. It is preferable that the melting point of the first solder bumps, the melting point of the second solder bumps and a melting point of the third solder bumps be different from each other. Mounting yield and connection reliability are high.

Figure 11A:
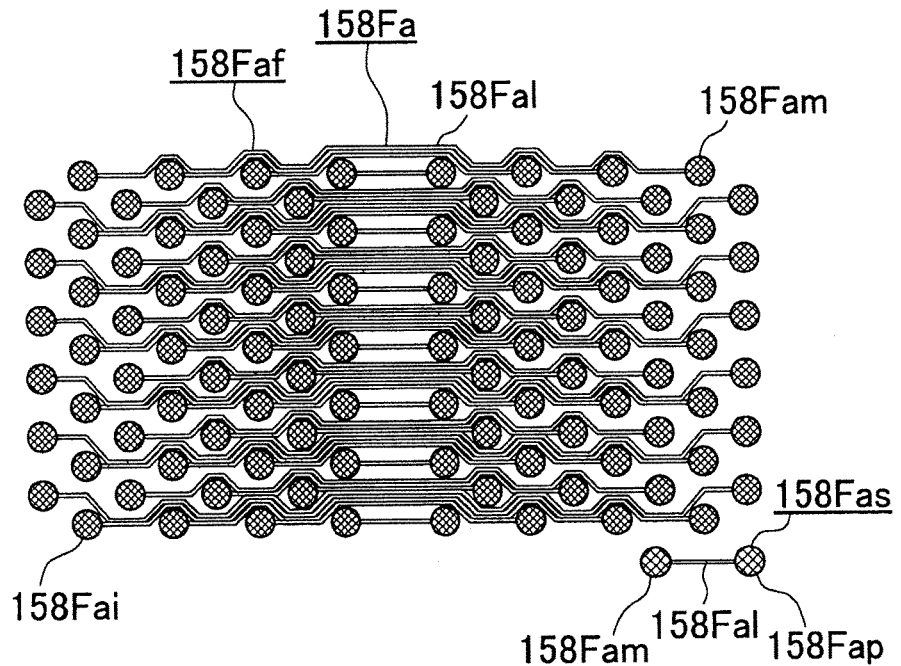
FIGS. 11A and 11B are plan views of a first conductor layer.

FIG. 11A is a plan view illustrating a portion of the first conductor layer (158Fa). The first conductor layer (158Fa) includes the second conductor circuits (158Faf) for data transmission between the electronic components and the first conductor circuits (158Fas) for routing. Conductors that are each depicted in a round shape in the figures are pads. Pads that are depicted on a left side of the second conductor circuits (158Faf) are first via conductor pads (158Fai), and pads that are depicted on a right side of the second conductor circuits (158Faf) are second via conductor pads (158Fam). The first via conductors (160Faf) are formed on the first via conductor pads, and the second via conductors (160Fas) are formed on the second via conductor pads. The second conductor circuits (158Faf) each include a first via conductor pad (158Fai), a second via conductor pad (158Fam), and a connection wiring (158Fal) that connects the first via conductor pad (158Fai) and the second via conductor pad (158Fam). In the package substrate of the first embodiment, all data transmission between the first electronic component such as a logic chip and the second electronic component such as a memory chip is performed via the second conductor circuits (158Faf).

A pad that is depicted on a right side of a first conductor circuit (158Fas) is a via conductor pad (158Fap), and a pad that is depicted on a left side of the first conductor circuit (158Fas) is a second via conductor pad (158Fam). A via conductor (160FaR) is formed on the via conductor pad (158Fap), and a via conductor (160FaR) is formed on the second via conductor pad (158Fam). The first conductor circuit (158Fas) includes the via conductor pad (158Fap), the second via conductor pad (158Fam), and a connection wiring (158Fal) that connects the via conductor pad (158Fap) and the second via conductor pad (158Fam).

Figure 11B:
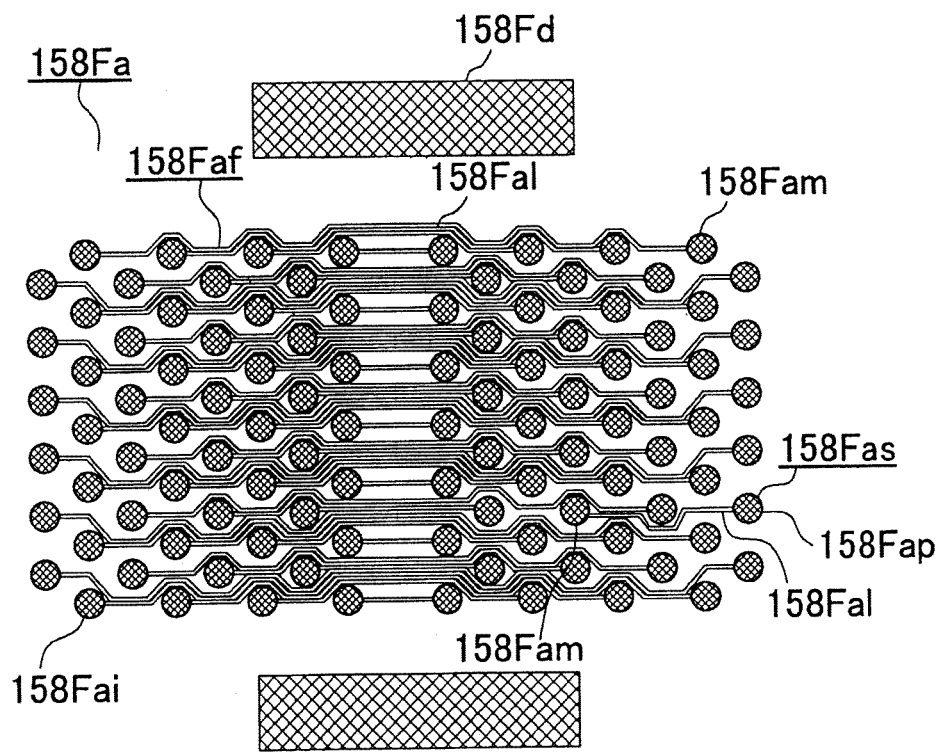

As illustrated in FIG. 11B, the via conductor pad (158Fap) of the first conductor circuit (158Fas) can be connected via the connection wiring (158Fal) to the second via conductor pad (158Fam) at any position and thus the package substrate of the first embodiment has a high degree of freedom for wiring.

In the package substrate of the first embodiment, in order to increase a wiring density, the first conductor layer (158Fa) is formed at a finer pitch than conductor layers on other layers. Therefore, the wiring width is narrow (for example, about 3-11 μm, and an optimal value is 5 μm), and the thickness is also small (for example, about 3-11 μm, and an optimal value is 5 μm). An area where the first conductor layer is in contact with the inner-layer interlayer resin insulating layer is 3%-15% of an area of an upper surface of the inner-layer interlayer resin insulating layer (area of the package substrate). Here, when the area is less than 3%, variation in plating thickness is increased. Therefore, a wiring is likely to break at a place where the wiring becomes too thin and thus, desired connection reliability cannot be obtained. On the other hand, when the area exceeds 15%, volumes of conductor circuits on front and back sides of the package substrate are different and unbalanced. That is, the volume of copper laminated on the upper side is larger than the volume of copper laminated on the lower side and, due to a thermal stress, an upper side rigidity becomes too higher than a lower side rigidity and warpage is likely to occur. Therefore, by making the area to be 3%-15%, an effect due to warpage is reduced and high connection reliability is obtained. FIG. 11A illustrates a case where the area of only the dedicated wiring layer (first conductor layer) (158Fa) exceeds 3% of that of the inner-layer interlayer resin insulating layer. FIG. 11B illustrates a case where the area of only the dedicated wiring layer (first conductor layer) (158Fa) is less than 3% of that of the inner-layer interlayer resin insulating layer. In this case, in order to make the copper area to be 3% or more, a dummy pattern (158Fd) is provided.

The second conductor circuits (158Fa) are sandwiched by a plane layer (158FbP) contained in the uppermost conductor layer and a plane layer (580FP) contained in the second conductor layer, and strip lines are formed. Transmission characteristics of the second conductor circuits are improved.

The inner-layer interlayer resin insulating layer has a thickness different from those of other interlayer resin insulating layers. Among the interlayer resin insulating layers, interlayer resin insulating layers other than the inner-layer interlayer resin insulating layer have the same thickness. The thickness of an interlayer resin insulating layer is equal to a distance between adjacent conductor layers. In FIG. 1A, a thickness (t1) of the outermost interlayer resin insulating layer (150Fb) and a thickness (t3) of the upper side interlayer resin insulating layer (50F) are equal. The thickness (t1, t3) of the interlayer resin insulating layers other than the inner-layer interlayer resin insulating layer is in a range from 15 μm to 40 μm. The thickness (t2) of the inner-layer interlayer resin insulating layer is in a range from 7.5 μm to 20 μm. The thickness (t2) of the inner-layer interlayer resin insulating layer is in a range from ½ to ⅓ of the thickness (t1, t3) of the other interlayer resin insulating layers. Fine skip via conductors can be formed. Due to the skip via conductors, a formation area of the first conductor layer is unlikely to be reduced. The package substrate becomes small. For example, the thickness (t2) of the inner-layer interlayer resin insulating layer (150Fa) is 13 μm, and the thickness of the interlayer resin insulating layers other than the inner-layer interlayer resin insulating layer is 35 μm.

In the package substrate of the first embodiment, the dedicated second conductor circuits in the first wiring layer are formed directly below the outermost interlayer resin insulating layer (150Fb). Therefore, a wiring distance between the electronic components is reduced. The signal transmission speed between the electronic components can be increased. The package substrate of the present embodiment has the dedicated second conductor circuits. Therefore, the signal lines have similar electrical characteristics. Transmission times of signals of a byte unit become uniform. Even when the transmission speed is fast, a signal can be properly transmitted. The processing is not slowed even when an amount of information is increased. The package substrate of the present embodiment does not have via conductors that penetrate through only the inner-layer interlayer resin insulating layer. The package substrate of the present embodiment has the skip via conductors that penetrate through the inner-layer interlayer resin insulating layer and the interlayer resin insulating layer on the inner-layer interlayer resin insulating layer. The package substrate is reduced in size. Transmission times of signals of a byte unit become uniform. Even when the transmission speed is fast, a signal can be properly transmitted. The processing is not slowed even when an amount of information is increased.

Method for Manufacturing Package Substrate of First Embodiment

A method for manufacturing the package substrate 10 of the first embodiment is illustrated in FIG. 3A-9C.

Figure 3A:
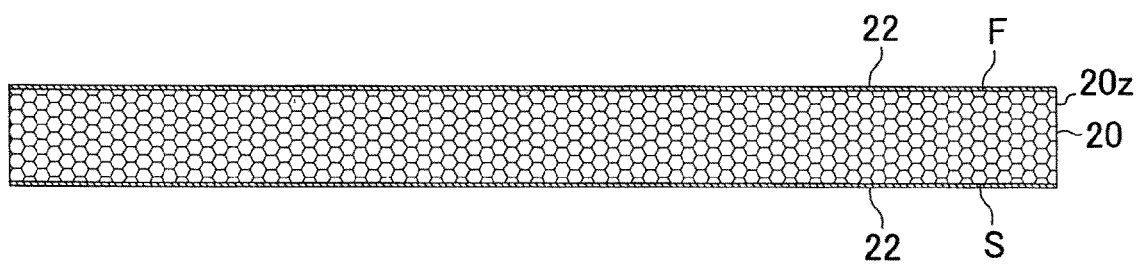
FIG. 3A-3C are process diagrams illustrating a method for manufacturing the package substrate of the first embodiment.

(1) A starting substrate 20 having a first surface (F) and a second surface (S) that is on an opposite side of the first surface is prepared. It is preferable that the starting substrate be a double-sided copper-clad laminated plate. The double-sided copper-clad laminated plate is formed from an insulating substrate (20z) having a first surface (F) and a second surface (S) that is on an opposite side of the first surface and metal foils 22, 22 that are respectively laminated on both sides of the insulating substrate (20z) (FIG. 3A). The starting substrate of the first embodiment is the double-sided copper-clad laminated plate. A surface of each of the copper foils 22 is subjected to a blackening treatment.

The insulating substrate (20z) is formed of a resin and a reinforcing material. Examples of the reinforcing material include a glass cloth, aramid fiber, glass fiber, and the like. Examples of the resin include an epoxy resin, a BT (bismaleimide triazine) resin, and the like.

Figure 3B:
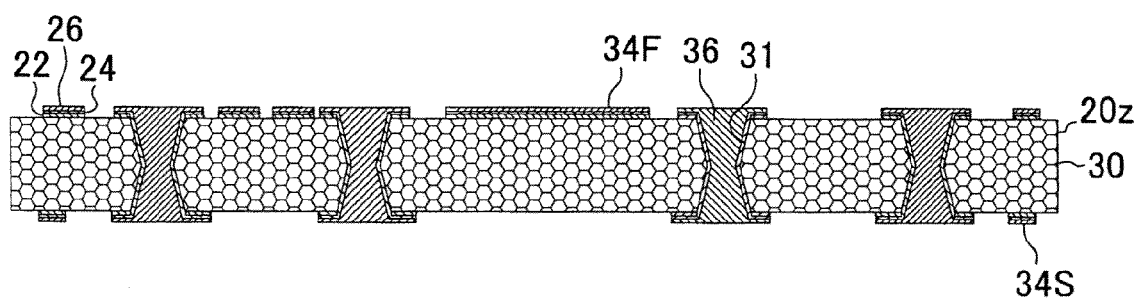

(2) The double-sided copper-clad laminated plate is processed, and the core substrate 30 is completed that includes the upper side conductor layer (34F), the lower side conductor layer (34S) and the through-hole conductors 36, the upper side conductor layer (34F) and the lower side conductor layer (34S) being each formed from the metal foil 22, an electroless plating film 24 and an electrolytic plating film 26, and the through-hole conductors 36 being formed in the through holes 31 (FIG. 3B). The first surface of the core substrate 30 and the first surface of the insulating substrate (20z) are the same surface; and the second surface of the core substrate 30 and the second surface of the insulating substrate (20z) are the same surface. The core substrate 30 is manufactured, for example, using a method described in U.S. Pat. No. 7,786,390. The entire contents of this publication are incorporated herein by reference.

Figure 3C:
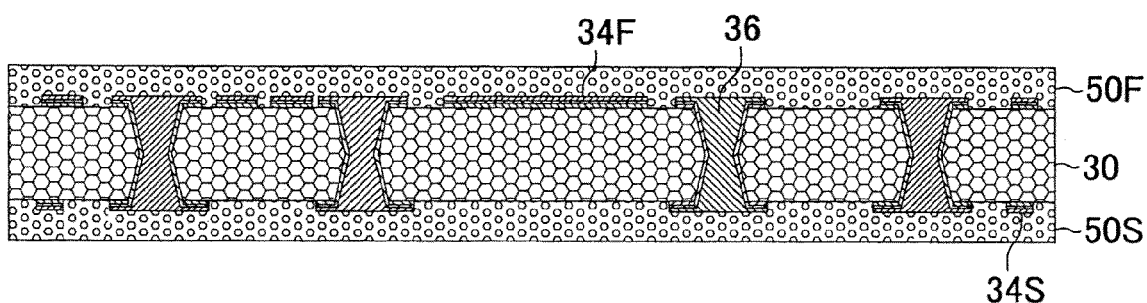

(3) The upper side interlayer resin insulating layer (50F) is formed on the first surface (F) of the core substrate 30. A lower side interlayer resin insulating layer (50S) is formed on the second surface (S) of the core substrate (FIG. 3C). The resin insulating layers each contain inorganic particles such as silica and a thermosetting resin such as epoxy. The interlayer resin insulating layers may each further contain a reinforcing material such as a glass cloth. The interlayer resin insulating layers (50F, 50S) each have a thickness of about 35 μm.

Figure 4A:
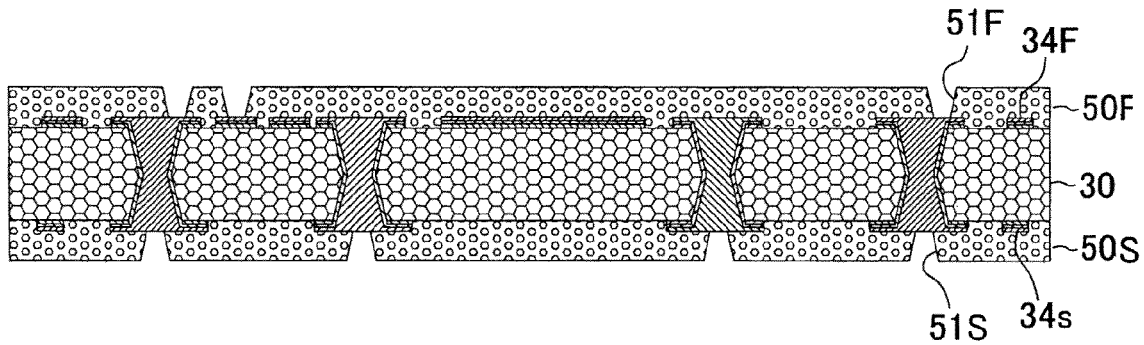
FIG. 4A-4D are process diagrams illustrating the method for manufacturing the package substrate of the first embodiment.

(4) Next, openings (51F, 51S) for via conductors are respectively formed in the interlayer resin insulating layers (50F, 50S) using CO2 gas laser (FIG. 4A).

Figure 4B:
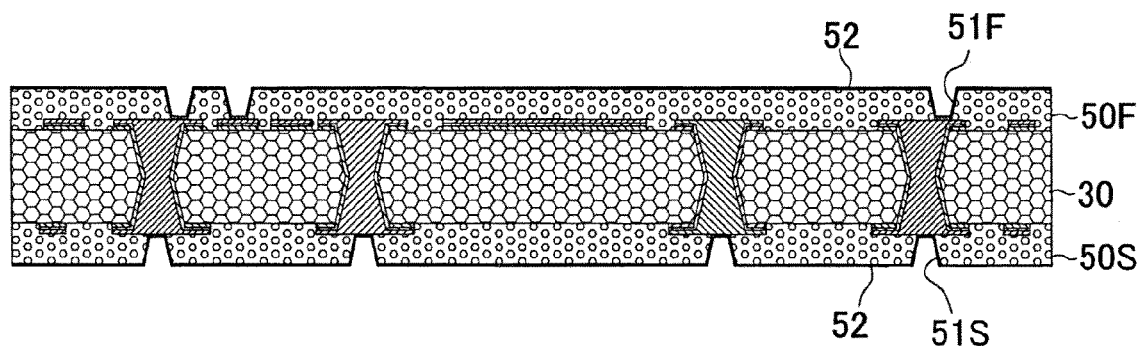

(5) Electroless copper plating films 52, 52 are formed on the interlayer resin insulating layers (50F, 50S) and on inner walls of the openings (51F, 51S) (FIG. 4B).

Figure 4C:
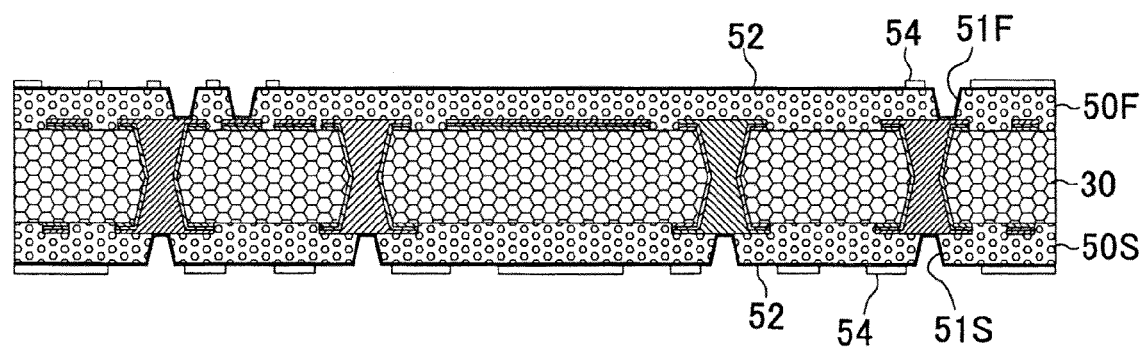

(6) A plating resist 54 is formed on the electroless copper plating film 52 (FIG. 4C).

Figure 4D:
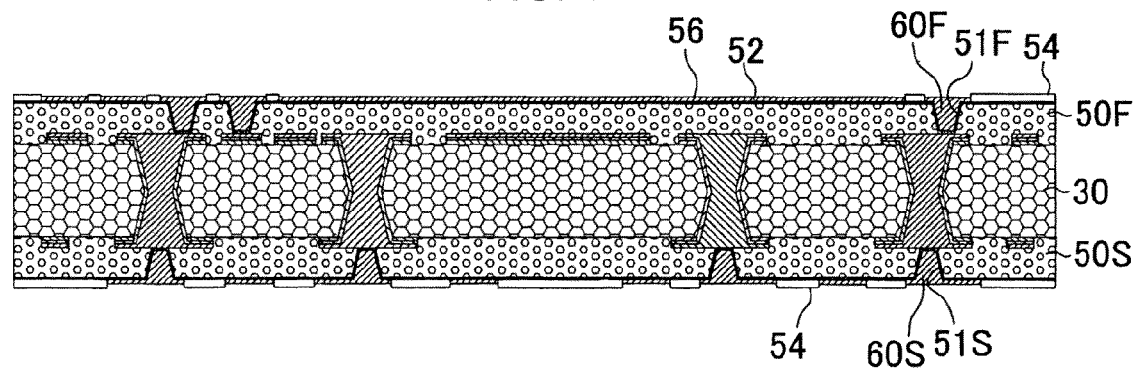

(7) An electrolytic copper plating film 56 is formed on the electroless copper plating film 52 that is exposed from the plating resist 54. In this case, the openings (51F, 51S) are filled with the electrolytic plating film 56. Via conductors (60F, 60S) are formed (FIG. 4D).

Figure 5A:
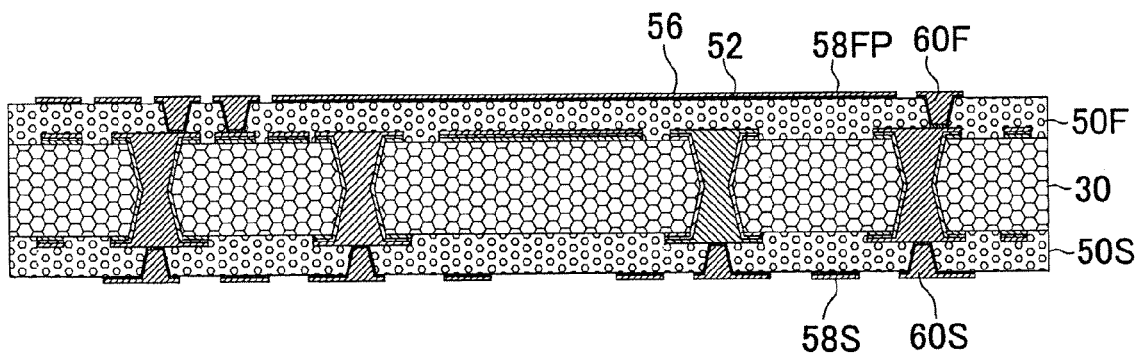
FIG. 5A-5C are process diagrams illustrating the method for manufacturing the package substrate of the first embodiment.

(8) The plating resist 54 is removed. The electroless plating film 52 that is exposed from the electrolytic plating film 56 is removed. The second conductor layer (upper side second conductor layer) (58FP) is formed on the interlayer resin insulating layer (50F). The second conductor layer (lower side second conductor layer) (58S) is formed on the interlayer resin insulating layer (50S) (FIG. 5A).

(9) A resin film of a B-stage is prepared that has a first surface and a second surface that is on an opposite of the first surface. A seed layer 151 is formed on the first surface of the resin film by sputtering. The seed layer is formed of copper or the like. The seed layer (sputtering film) has a thickness in a range from 0.05 μm to 0.3 μm. The resin film with the seed layer is laminated on the upper side second conductor layer (58FP) and on the upper side interlayer resin insulating layer (50F) in a manner that the second surface of the resin film opposes the upper side interlayer resin insulating layer (50F). Thereafter, the resin film is cured and thereby, the inner-layer interlayer resin insulating layer (upper side inner-layer interlayer resin insulating layer) (150Fa) is formed on the upper side second conductor layer (58FP) and on the upper side interlayer resin insulating layer (50F). In the present embodiment, the upper side inner-layer interlayer resin insulating layer is an interlayer resin insulating layer with a seed layer.

The package substrate of the present embodiment does not have via conductors that penetrate through only the inner-layer interlayer resin insulating layer. Therefore, the seed layer can be formed on the resin film before the lamination. Since the seed layer is formed by sputtering before the lamination, the seed layer has a thin and uniform thickness.

However, it is also possible that the seed layer is formed on the inner-layer interlayer resin insulating layer after the inner-layer interlayer resin insulating layer is formed. The package substrate of the present embodiment does not have via conductors that penetrate through only the inner-layer interlayer resin insulating layer. Therefore, even when the seed layer is formed after the lamination, there is no need to form a seed layer on inner walls of openings for via conductors. Therefore, the seed layer has a thin and uniform thickness.

Figure 5B:
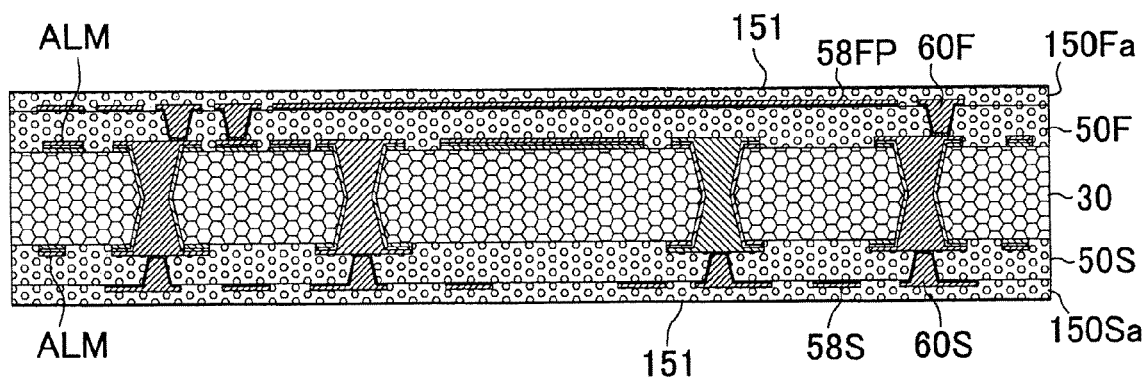

Similarly, an inner-layer interlayer resin insulating layer (lower side inner-layer interlayer resin insulating layer) (150Sa) is formed on the lower side second conductor layer (58S) and on the lower side interlayer resin insulating layer (50S) (FIG. 5B). In the present embodiment, the lower side inner-layer interlayer resin insulating layer is an interlayer resin insulating layer with a seed layer.

The inner-layer interlayer resin insulating layers (150Fa, 150Sa) each have a thickness of 17 μm, which is about ½ of the thickness of the interlayer resin insulating layers (50F, 50S).

Figure 5C:
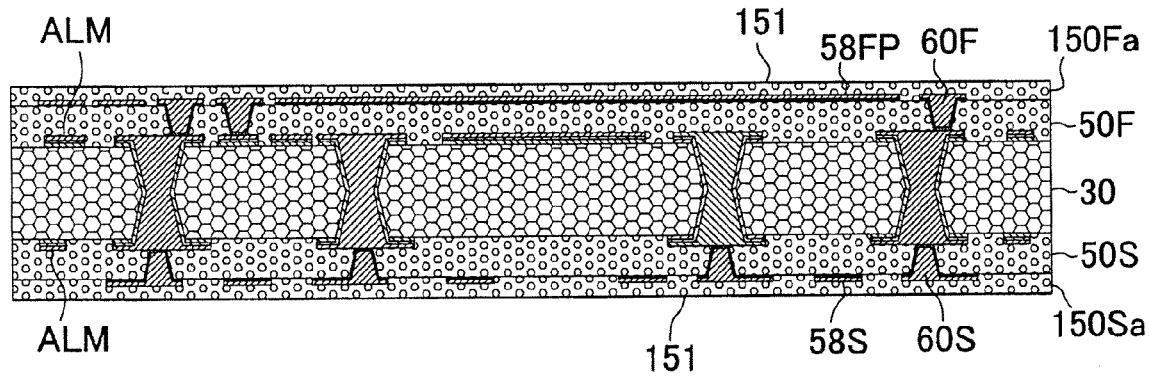
Figure 6A:
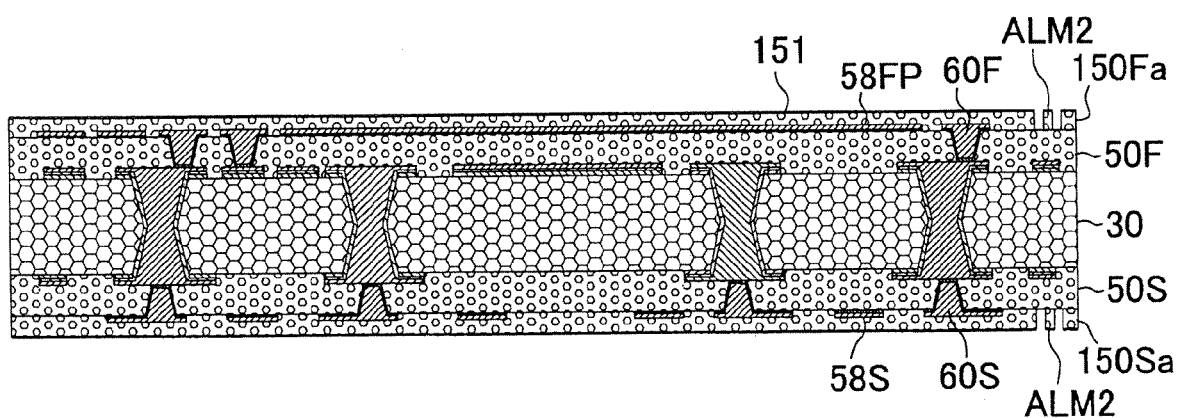
FIGS. 6A and 6B are process diagrams illustrating the method for manufacturing the package substrate of the first embodiment.
Figure 6B:
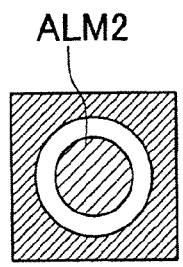

(10) A portion of the seed layer that is formed on the inner-layer interlayer resin insulating layer is removed. As a result, the seed layer on an alignment mark (ALM) that is formed in the second conductor layer is removed (FIG. 5C). In this case, the seed layer in an area where an alignment mark (ALM2) (to be described later) is formed is also removed. The alignment mark (ALM2) is formed in the inner-layer interlayer resin insulating layer with the alignment mark formed in the second conductor layer as a reference (FIG. 6A). An example of the alignment mark (ALM2) is depicted in FIG. 6B. Shaded portions are portions of the upper surface of the inner-layer interlayer resin insulating layer. A non-shaded portion is a groove. The alignment mark is formed by the inner-layer interlayer resin insulating layer and the groove that is formed in the inner-layer interlayer resin insulating layer. For example, the alignment mark is a ring-shaped groove that is formed in the inner-layer interlayer resin, and is formed using laser.

Figure 7A:
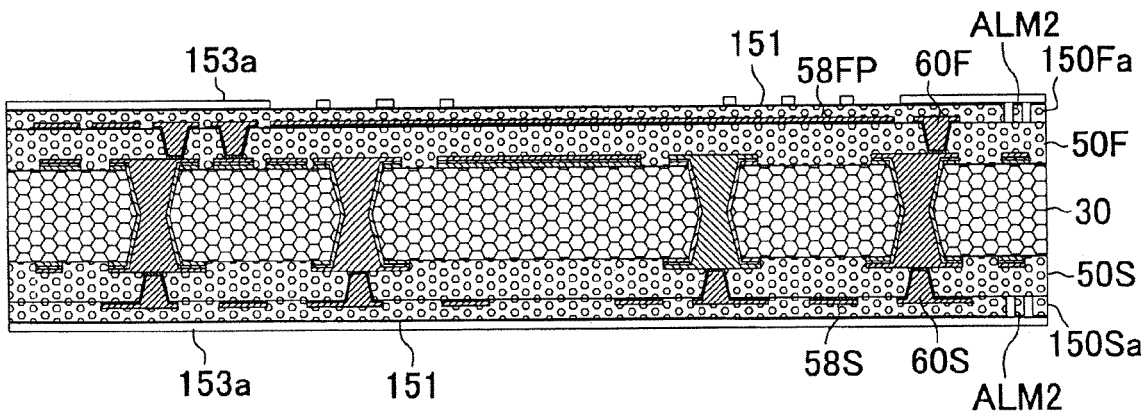
FIG. 7A-7C are process diagrams illustrating the method for manufacturing the package substrate of the first embodiment.

(11) A plating resist (153a) is formed on the seed layer 151 with the alignment mark (ALM2) as a reference (FIG. 7A). The plating resist (153a) on the lower side inner-layer interlayer resin insulating layer is formed on the entire surface thereof.

Figure 7B:
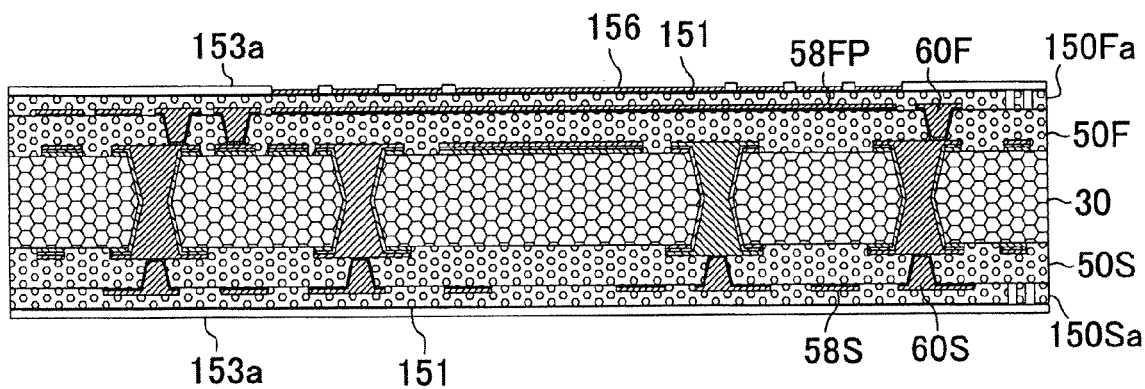

(12) An electrolytic copper plating layer 156 is formed on the seed layer 151 that is exposed from the plating resist (153a) (FIG. 7B).

Figure 7C:
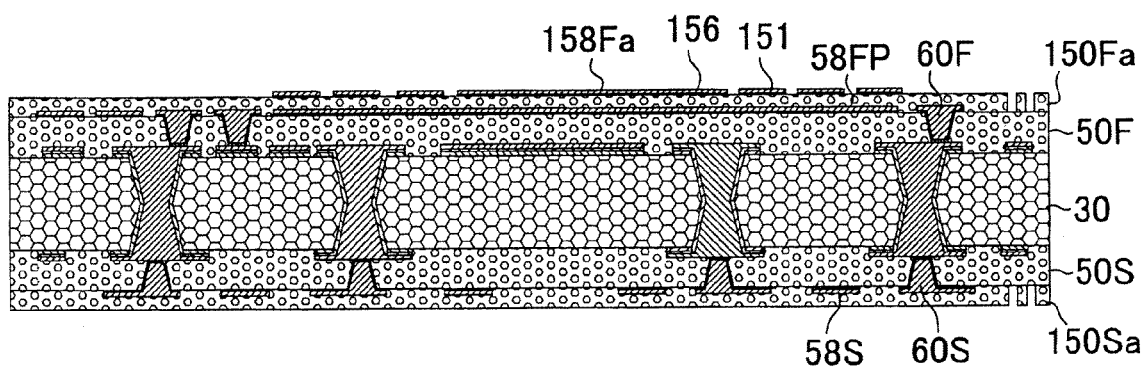
Figure 8A:
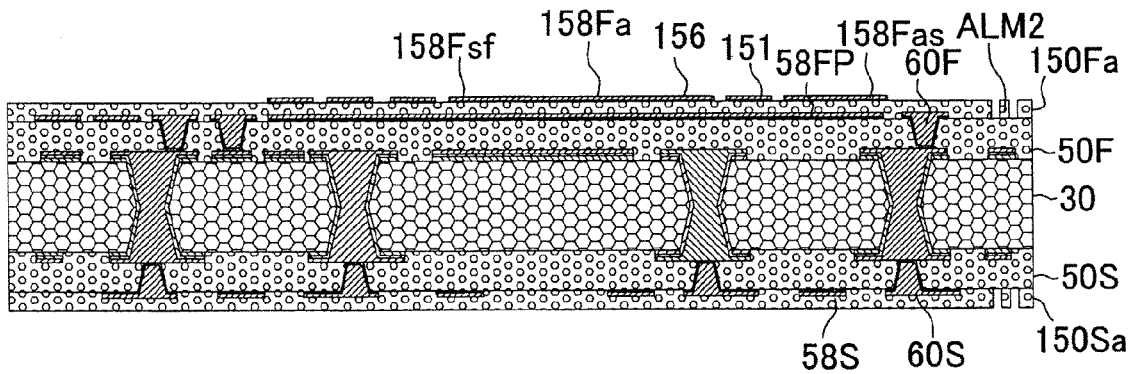
FIG. 8A-8C are process diagrams illustrating the method for manufacturing the package substrate of the first embodiment.

(13) The plating resist (153a) is removed (FIG. 7C). The seed layer 151 that is exposed from the electrolytic copper plating layer 156 is removed. The first conductor layer (upper side first conductor layer) (158Fa) that includes the seed layer 151 and the electrolytic copper plating layer 156 on the seed layer is formed on the upper side inner-layer interlayer resin insulating layer (150Fa) (FIG. 8A). A portion of the first conductor layer (158Fa) is illustrated in FIGS. 11A and 11B. FIGS. 11A and 11B are plan views. L/S (line/space) of the second conductor circuits (158Faf) contained in the first conductor layer is, for example, 5/5 μm. The first via conductor pads (158Fai) and the second via conductor pads (158Fam) are also formed at the same time. The first conductor layer includes the via conductor pads and a first alignment mark that is formed at the same time. The first alignment mark is not illustrated in the drawings. When the resin film for forming the lower side inner-layer interlayer resin insulating layer is a resin film with a seed layer, the seed layer is removed. Since the seed layer is completely removed, it is preferable that the inner-layer interlayer resin insulating layer in the second build-up layer be formed from a resin film that does not have a seed layer. A conductor layer is not formed on the lower side inner-layer interlayer resin insulating layer.

Figure 8B:
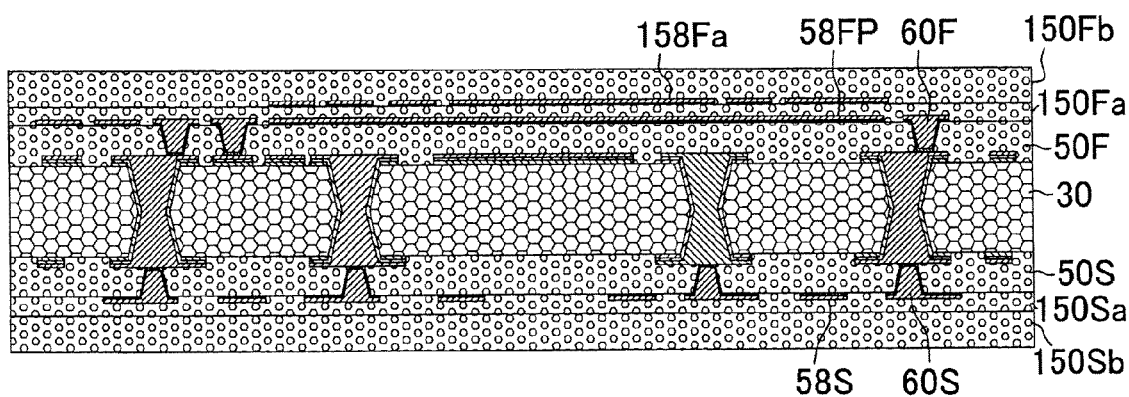

(14) The outermost interlayer resin insulating layer (upper side outermost interlayer resin insulating layer) (150Fb) is formed on the upper side inner-layer interlayer resin insulating layer and on the upper side first conductor layer (dedicated wiring layer). An outermost interlayer resin insulating layer (lower side outermost interlayer resin insulating layer) (150Sb) is formed on the lower side inner-layer interlayer resin insulating layer (FIG. 8B). The interlayer resin insulating layers (150Fb, 150Sb) have thicknesses the same as those of the interlayer resin insulating layers (50F, 50S).

(15) First openings (151Fa) that penetrate through the upper side outermost interlayer resin insulating layer (150Fb) and reach the first conductor layer (158Fa) and the second openings (151Fb) that penetrate through the upper side outermost interlayer resin insulating layer (150Fb) and the upper side inner-layer interlayer resin insulating layer (150Fa) and reach the upper side second conductor layer (58FP) are formed using laser with the first alignment mark as a reference.

Figure 8C:
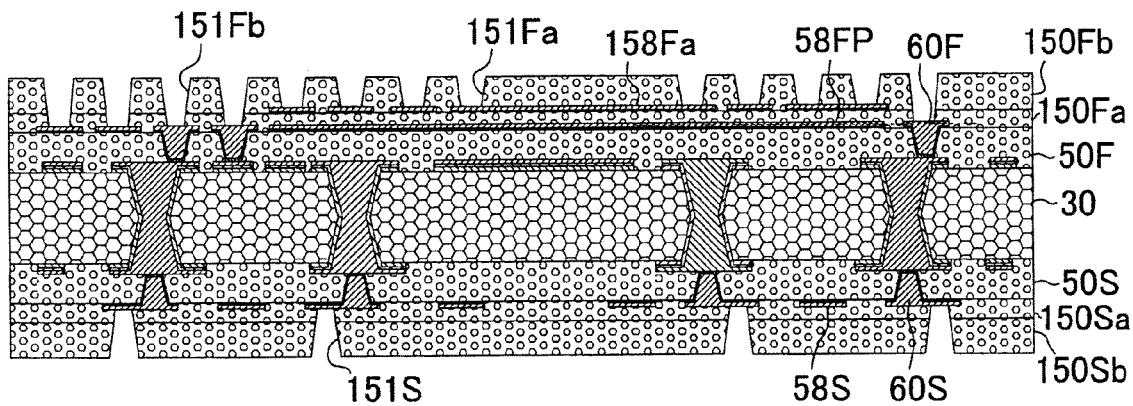

Openings (151S) that penetrate through the lower side outermost interlayer resin insulating layer (150Sb) and the lower side inner-layer interlayer resin insulating layer (150Sa) and reach the lower side second conductor layer (58S) are formed (FIG. 8C).

Figure 9A:
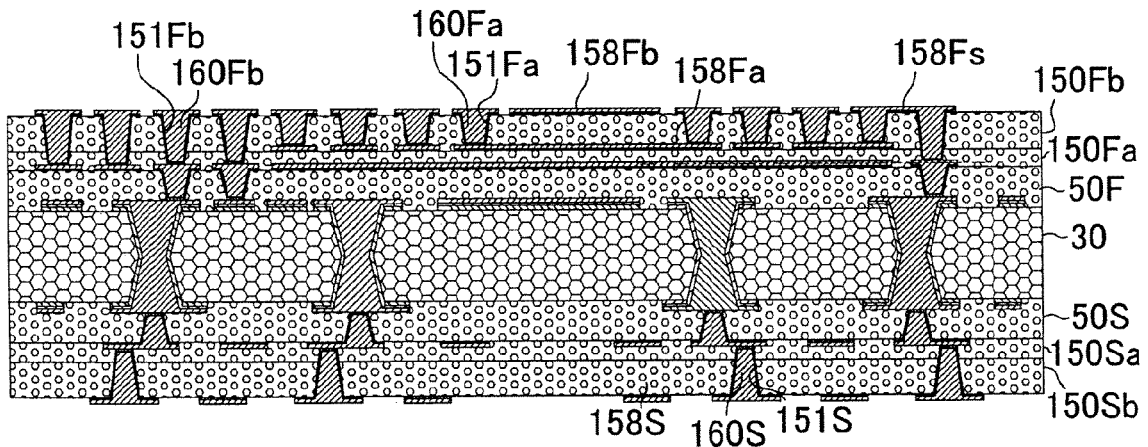
FIG. 9A-9C are process diagrams illustrating the method for manufacturing the package substrate of the first embodiment.

(16) The via conductors (160Fa, 160Fb, 160S) are formed in the openings (151Fa, 151Fb, 151S) for the formation of the via conductors using a semi-additive method. Further, the outermost conductor layers (158Fb, 158S) are formed (FIG. 9A). The via conductors (160Fb, 160S) are skip via conductors, penetrate through both the outermost interlayer resin insulating layer and the inner-layer interlayer resin insulating layer and connect the outermost conductor layer and the second conductor layer. The outermost conductor layer and the second conductor layer have plane layers that sandwich the second conductor circuits. The outermost conductor layer and the first conductor layer are connected by the via conductors (160Fa).

The upper side outermost conductor layer includes the first pad group and the second pad group. There are four second pad groups including a first group, a second group, a third group and a fourth group. As illustrated in FIGS. 10A and 10B, the second pad groups surround the first pad group. Each second pad group is formed on outside of each side of the first pad group.

Figure 9B:
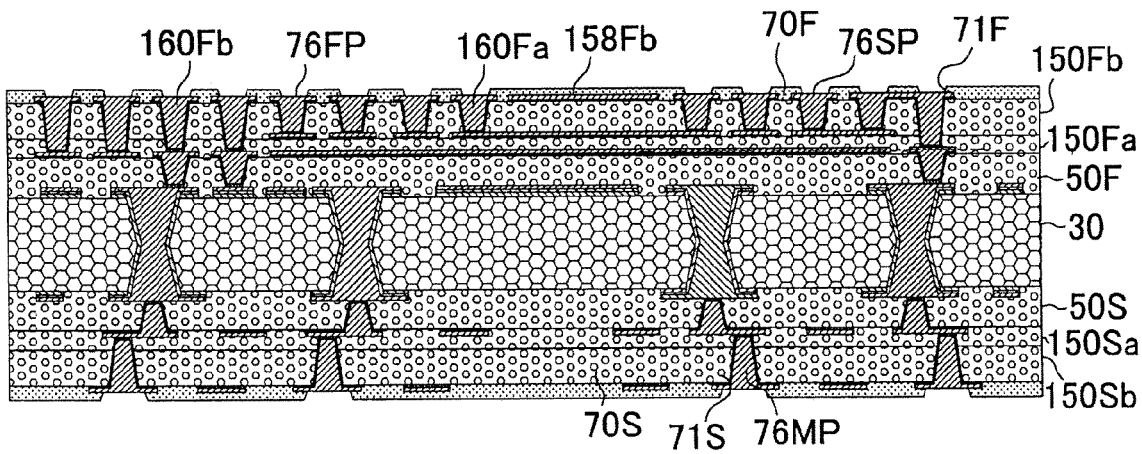

(17) The upper side solder resist layer (70F) having the openings (71F) is formed on the first build-up layer. The lower side solder resist layer (70S) having the openings (71S) is formed on the second build-up layer (FIG. 9B). Upper surfaces of the first pads (76FP) and the second pads (76SP) are exposed from the openings (71F) of the first solder resist layer (70F). On the other hand, upper surfaces of the conductor layer and via lands that are exposed from the openings (71S) of the second solder resist layer (70S) function as the pads (76MP) for connecting to a motherboard.

Figure 9C:
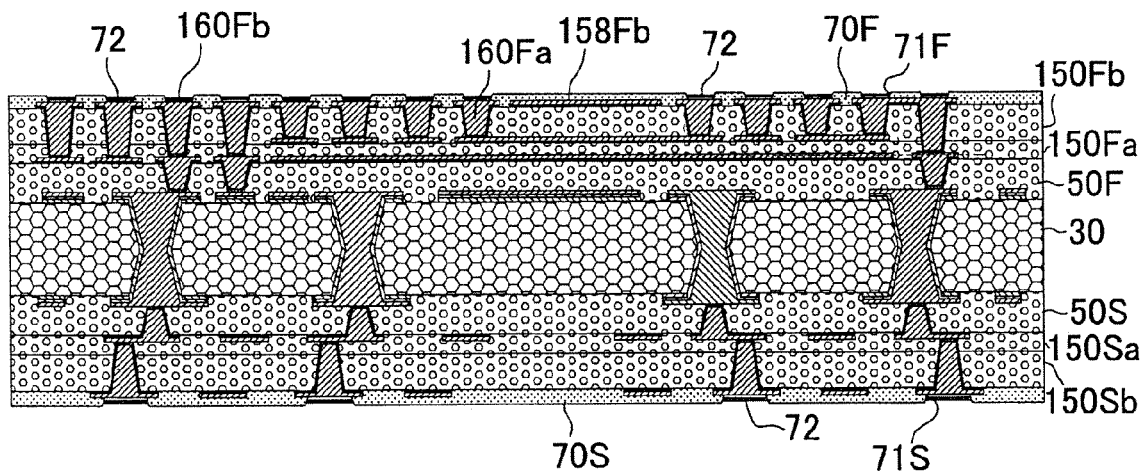

(18) A nickel plating layer is formed on each of the pads (76FP, 76SP, 76MP), and a gold plating layer is further formed on the nickel plating layer. Thereby, the metal layer 72 including the nickel plating layer and the gold plating layer is formed (FIG. 9C). It is also possible that, instead of the nickel-gold layer, a nickel-palladium-gold layer or an OSP film is formed.

(19) Solder balls are mounted on the pads (76FP, 76SP, 76MP), and the solder bumps (76FM, 76FL, 76S) are formed by reflow. The package substrate 10 is completed (FIG. 1A).

(20) The logic IC chip (110L) is mounted on the solder bumps (76FL) on the first pads. The memory (110M) is mounted on the solder bumps (76FM) on the second pads (FIGS. 2 and 10B). Spaces between the package substrate and the IC chip (110L) and the memory (110M) are filled with an underfill 114 (FIG. 2).

Second Embodiment

Figures 12A, 12B:
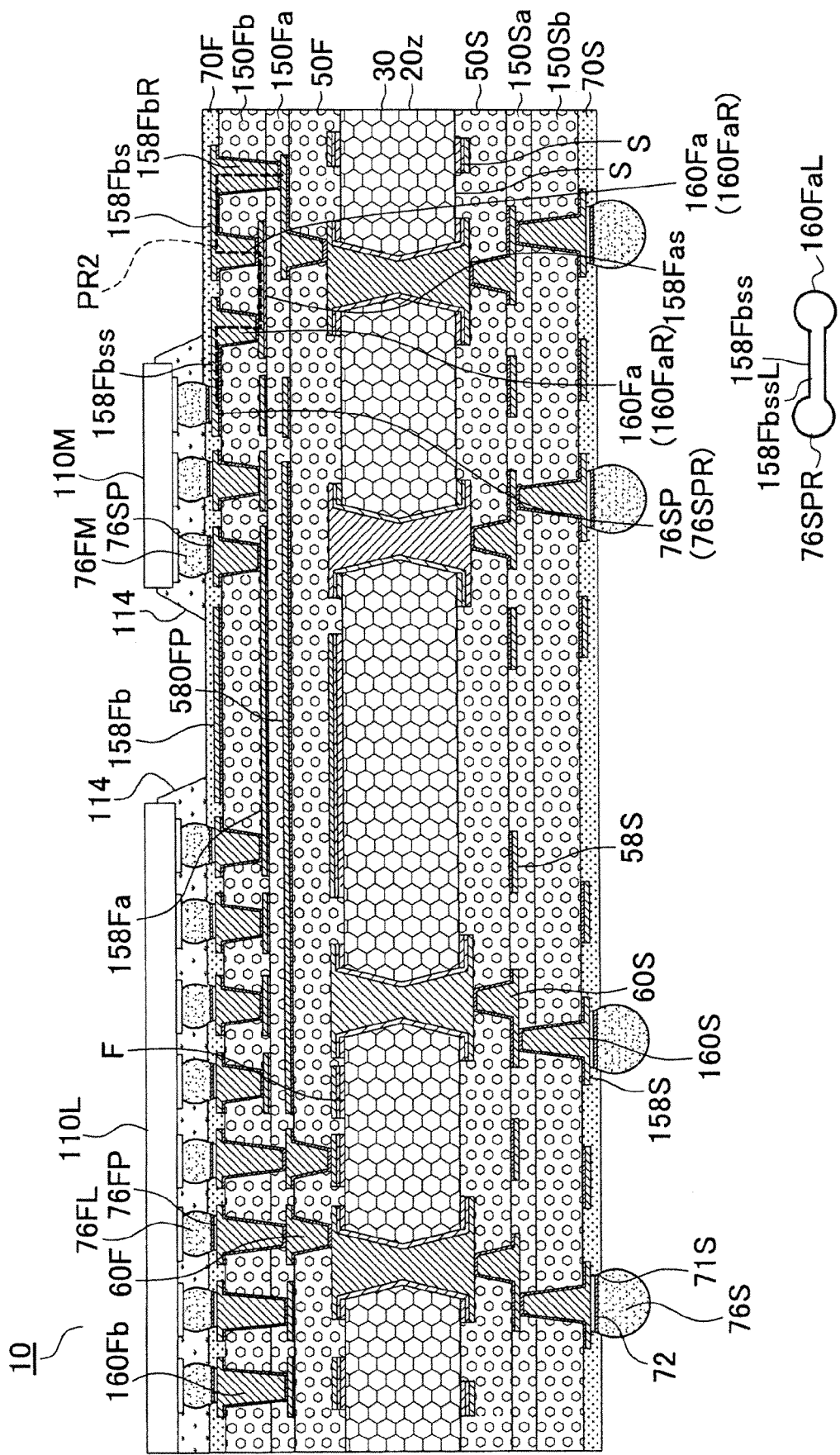
FIG. 12A is a cross-sectional view of an application example of a package substrate according to a second embodiment.
FIG. 12B is a plan view of an outermost conductor circuit.

FIG. 12A is a cross-sectional view of an application example of a package substrate according to a second embodiment.

In the second embodiment, a connection path (RP2) is formed via a pad (76SPR) that is connected to the memory (110M), an outermost second conductor circuit (158Fbss) that connects the pad (76SPR) and a via conductor (160FaR), the via conductor (160FaR), a first conductor circuit (158Fas), another via conductor (160FaR), an outermost conductor circuit (158Fbs), and a skip via conductor (160FbR). FIG. 12B illustrates a plan view of the outermost second conductor circuit (158Fbss). The outermost second conductor circuit (158Fbss) is formed from a land (76SPR), a land (160FaL) of a via conductor (160Fa) and a connection wire (158FbssL) that connects the two lands. Via the connection path (PR2), a signal from the pad connected to the memory (110M) can be transmitted to the second surface side of the package substrate via the skip via conductor. Since such a connection path (circuit) (PR2) is provided, the package substrate of the second embodiment has a high degree of freedom for wiring.

Also in the second embodiment, similar to the first embodiment described with reference to FIG. 11A, a first conductor layer (158Fa) that includes second conductor circuits (158Faf) and first conductor circuits (158Fas) is formed below the outermost interlayer resin insulating layer (150Fb). The first pads and the second pads are connected by the second conductor circuits (158Faf). That is, exchange of a signal or the like between the first electronic component and the second electronic component is performed via the second conductor circuits. All of the second conductor circuits connect the first pads and the second pads. Therefore, also in the present embodiment, variations in the widths and the thicknesses of the signal lines are reduced. The signal lines have substantially the same transmission speeds. The signals are properly processed. The processing is not slowed even when an amount of information is large.

Japanese Patent Laid-Open Publication No. HEI 06-53349 describes a multichip module substrate which has four wiring layers. It appears that all of the four layers each have a wiring connecting the two LSIs. The multichip module substrate may have a power-source wiring and a ground wiring that are connected to the power-source line and the ground line of the LSIs. Among the four wiring layers, at least one wiring layer may have both the wiring that connects the two LSIs and the power-source wiring or the ground wiring. Therefore, in the multichip module substrate, it may be difficult to increase a transmission speed between electronic components.

A package substrate according to an embodiment of the present invention allows a signal transmission speed between electronic components to be increased and has a high degree of freedom for wiring.

A package substrate according to an embodiment of the present invention includes: an outermost interlayer resin insulating layer that has a first surface and a second surface that is on an opposite side of the first surface; an outermost conductor layer that is formed on the first surface of the outermost interlayer resin insulating layer and includes a first pad group and a second pad group, the first pad group being formed by pads for mounting a first electronic component and the second pad group being formed by pads for mounting a second electronic component; a first conductor layer that is formed below the second surface of the outermost interlayer resin insulating layer; an inner-layer interlayer resin insulating layer that is formed below the second surface of the outermost interlayer resin insulating layer and the first conductor layer; a second conductor layer that is formed below the inner-layer interlayer resin insulating layer; outermost via conductors that penetrate through the outermost interlayer resin insulating layer and connect the first conductor layer and the outermost conductor layer; and skip via conductors that penetrate through both the outermost interlayer resin insulating layer and the inner-layer interlayer resin insulating layer and connect the outermost conductor layer and the second conductor layer. The pads and the second conductor layer have a connection path via a first conductor circuit that is included in the first conductor layer and connects two of the via conductors and an outermost conductor circuit that is included in the outermost conductor layer and connects one of the via conductors and one of the skip via conductors.

Obviously, numerous modifications and variations of the present invention are possible in light of the above teachings. It is therefore to be understood that within the scope of the appended claims, the invention may be practiced otherwise than as specifically described herein.

What is claimed is:

1. A package substrate, comprising:
an inner resin insulating interlayer;
a first conductor layer formed on the inner resin insulating interlayer;
a second conductor layer on which the inner resin insulating interlayer is formed;
an outermost resin insulating interlayer formed on the first conductor layer;
an outermost conductor layer formed on the outermost resin insulating interlayer and comprising a plurality of first pads and a plurality of second pads such that the plurality of first pads is positioned to mount a first electronic component on the outermost resin insulating interlayer and the plurality of second pads is positioned to mount a second electronic component on the outermost resin insulating interlayer;
a plurality of outermost via conductors formed through the outermost resin insulating interlayer such that the plurality of outermost via conductors is connecting the first conductor layer and the outermost conductor layer; and
a plurality of skip via conductors formed through the outermost resin insulating interlayer and the inner resin insulating interlayer such that the plurality of skip via conductors is connecting the outermost conductor layer and the second conductor layer,
wherein the first conductor layer includes a first conductor circuit connecting two of the outermost via conductors, and the outermost conductor layer includes an outermost conductor circuit connecting one of the two of the outermost via conductors and one of the skip via conductors such that the first conductor circuit, the two of the outermost via conductors, the outermost conductor circuit and the one of the skip via conductors form a connection path connecting one of the second pads and the second conductor layer.

2. A package substrate according to claim 1, wherein the first conductor layer includes a second conductor circuit connecting one of the first pads and one of the second pads.

3. A package substrate according to claim 1, wherein the first conductor layer includes a second conductor circuit connecting one of the first pads and one of the second pads such that the second conductor circuit forms a dedicated wiring layer configured to transmit data between the first electronic component and the second electronic component.

4. A package substrate according to claim 1, wherein the inner resin insulation interlayer does not have a via conductor penetrating only through the inner resin insulation interlayer.

5. A package substrate according to claim 1, wherein the outermost conductor layer, the first conductor circuit of the first conductor layer and the second conductor layer form a strip line structure.

6. A package substrate according to claim 1, wherein the first electronic component is a logic IC component, and the second electronic component is a memory component.

7. A package substrate according to claim 1, wherein the first electronic component is a logic IC component, the plurality of first pad is positioned to mount the logic IC component on a center portion of the outermost resin insulating interlayer, the second electronic component is a memory component, and the plurality of second pad is positioned to mount the memory component on a side portion of the outermost resin insulating interlayer such that the connection path is connecting the memory component and the one of the skip via conductors.

8. A package substrate according to claim 2, wherein the inner resin insulation interlayer does not have a via conductor penetrating only through the inner resin insulation interlayer.

9. A package substrate according to claim 3, wherein the inner resin insulation interlayer does not have a via conductor penetrating only through the inner resin insulation interlayer.

10. A package substrate according to claim 2, wherein the outermost conductor layer, the first conductor circuit of the first conductor layer and the second conductor layer form a strip line structure.

11. A package substrate according to claim 3, wherein the outermost conductor layer, the first conductor circuit of the first conductor layer and the second conductor layer form a strip line structure.

12. A package substrate according to claim 4, wherein the outermost conductor layer, the first conductor circuit of the first conductor layer and the second conductor layer form a strip line structure.

13. A package substrate according to claim 2, wherein the first electronic component is a logic IC component, and the second electronic component is a memory component.

14. A package substrate according to claim 3, wherein the first electronic component is a logic IC component, and the second electronic component is a memory component.

15. A package substrate according to claim 4, wherein the first electronic component is a logic IC component, and the second electronic component is a memory component.

16. A package substrate according to claim 5, wherein the first electronic component is a logic IC component, and the second electronic component is a memory component.

17. A package substrate according to claim 2, wherein the first electronic component is a logic IC component, the plurality of first pad is positioned to mount the logic IC component on a center portion of the outermost resin insulating interlayer, the second electronic component is a memory component, and the plurality of second pad is positioned to mount the memory component on a side portion of the outermost resin insulating interlayer such that the connection path is connecting the memory component and the one of the skip via conductors.

18. A package substrate according to claim 3, wherein the first electronic component is a logic IC component, the plurality of first pad is positioned to mount the logic IC component on a center portion of the outermost resin insulating interlayer, the second electronic component is a memory component, and the plurality of second pad is positioned to mount the memory component on a side portion of the outermost resin insulating interlayer such that the connection path is connecting the memory component and the one of the skip via conductors.

19. A package substrate according to claim 4, wherein the first electronic component is a logic IC component, the plurality of first pad is positioned to mount the logic IC component on a center portion of the outermost resin insulating interlayer, the second electronic component is a memory component, and the plurality of second pad is positioned to mount the memory component on a side portion of the outermost resin insulating interlayer such that the connection path is connecting the memory component and the one of the skip via conductors.

20. A package substrate according to claim 5, wherein the first electronic component is a logic IC component, the plurality of first pad is positioned to mount the logic IC component on a center portion of the outermost resin insulating interlayer, the second electronic component is a memory component, and the plurality of second pad is positioned to mount the memory component on a side portion of the outermost resin insulating interlayer such that the connection path is connecting the memory component and the one of the skip via conductors.

* * * * *